United States Patent [19]

Powell et al.

[11] Patent Number: 4,971,653
[45] Date of Patent: Nov. 20, 1990

[54] TEMPERATURE CONTROLLED CHUCK FOR ELEVATED TEMPERATURE ETCH PROCESSING

[75] Inventors: Gary B. Powell, Petaluma; David J. Drage, Sebastopol; Tony Sie, Walnut Creek, all of Calif.

[73] Assignee: Matrix Integrated Systems, Richmond, Calif.

[21] Appl. No.: 494,173

[22] Filed: Mar. 14, 1990

[51] Int. Cl.$^5$ .................. B44C 1/22; H01L 21/306; C23F 1/00; C03C 15/00

[52] U.S. Cl. .................. 156/626; 156/643; 156/345; 156/646; 204/192.33; 204/298.32

[58] Field of Search ............ 156/643, 646, 345, 626, 156/627; 204/192.32, 192.33, 298.32, 298.39; 427/38, 39; 118/50.1, 620, 724

[56] References Cited

U.S. PATENT DOCUMENTS 4,565,601  1/1986  Kakehi et al. ............. 156/643
4,886,571  12/1989  Suzuki et al. ............. 156/646

Primary Examiner—William A. Powell

[57] ABSTRACT

A parallel plate plasma type etching apparatus is provided with a temperature control chuck 44 so that elevated substrate temperatures are controlled. With an elevated substrate temperature, the reaction rate is increased. With positive temperature control, the likelihood of damage to the semiconductor devices is significantly reduced. The chuck is provided with a large number of equally spaced electrical heaters 72 and control of the heaters is by a temperature sensor 74.

10 Claims, 3 Drawing Sheets

TEMPERATURE CONTROLLED CHUCK FOR ELEVATED TEMPERATURE ETCH PROCESSING

BACKGROUND OF THE INVENTION

The present invention relates to reactors used in semiconductor processing and more particularly to the acceleration of a plasma etching process with a reliable elevated temperature control so as to reduce the likelihood of substrate damage.

Typically, semiconductor devices are manufactured by using combinations of differing layers of conductive, insulating, and semiconducting materials. It is often necessary to form openings in an upper substrate layer on a wafer so that contact can be made with an underlying substrate layer. To accomplish this, a mask is deposited on the substrate. The mask is patterned to cover selected regions while leaving other regions exposed. The wafer is then subjected to a corrosive type of environment which will etch the exposed portion of the substrate. However, the etching materials also tend to etch the masks. It has been an ongoing objective of the industry to develop etching methods and apparatus which will selectively etch substrates on a cost effective basis.

Dry etchers use gas which forms a plasma to etch the substrate. Dry etching techniques are often referred to as reactive ion etching or plasma etching. In the prior art types of dry etchers, a plasma is formed by injecting a gas into an area between two electrodes. The reaction of the gas to the RF field produces a plasma which generates ions. The ions then collide with the substrates causing portions of the surface of the substrate to etch, or chip, off.

In the prior art etchers, the chemical reaction rates are frequently unacceptably low. With elevated temperatures, the reaction rate is increased, but control is not sufficiently precise to reliably produce acceptable products. Efficient use of the apparatus with a variety of different semiconductor materials is a continuing goal. Control of substrate temperature by using a prior art temperature controlled water recirculation unit is limited to temperatures less than 100° C., which is too low for many substrate materials. Elevating the substrate temperature by reliance on plasma or other radiation heating as in the prior art is unreliable due to lack of temperature regulation.

SUMMARY OF INVENTION

An object of the present invention is to provide a novel apparatus and method for providing stability and control of the temperature of a substrate mounted for plasma etching at higher temperatures than has been heretofore possible.

Another object is to provide a novel apparatus capable of being efficiently used with a variety of semiconductor materials for which optimum etching temperatures vary in a range extending from less than 80° C. to 140° C. and above.

A further object of the invention is to provide in such apparatus a closed loop temperature control which employs electrical heat adding equipment together with one or more temperature sensing devices in the substrate chuck to regulate the heat added. Optionally, water cooling to improve stability and control at high temperatures and to allow operation where the substrate temperature is to be maintained below about 80° C. may be provided.

Still another object of the invention is to provide a novel chuck that is heat insulated from its frame or housing and contains cartridge shaped electrical heaters that are disposed in a pattern to provide heating that is uniform together with one or more temperature sensors that control the heaters to provide stability and control of temperatures in the desired operating range which may be in excess of 140° C. In a preferred embodiment where six electrical heaters are employed, three temperature sensing elements are equally spaced about the chuck and connected to control the two adjacent electrical heaters o opposite sides thereof.

These and other objects of the invention will be more fully apparent from the claims and from the description as it proceeds in connection with the appended drawings.

DETAILED DESCRIPTION OF PREFERRED EMBODIMENTS

Figure 1:
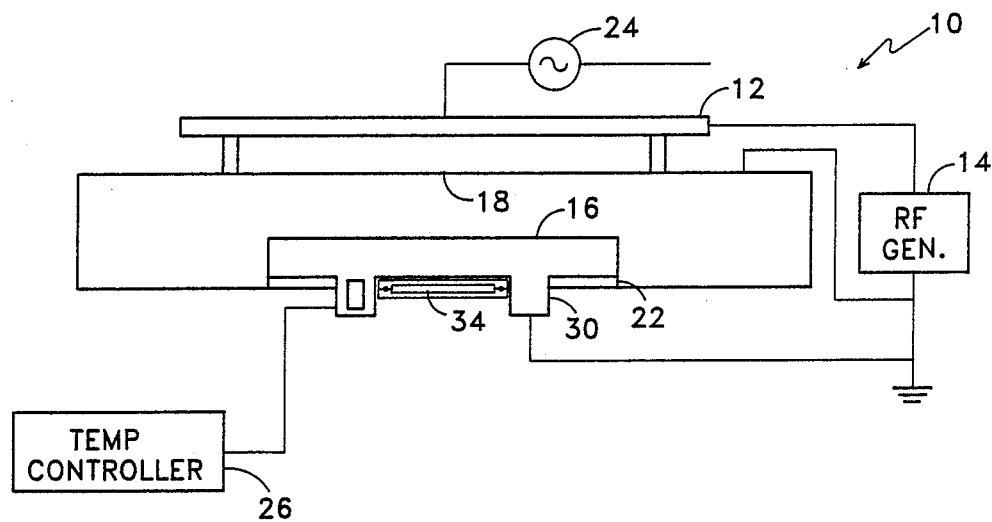
FIG. 1 is a diagrammatic view of a parallel plate reactor embodying the present invention.

Referring now to FIG. 1, a parallel plate reactor is generally designated 10 and includes an upper electrode 12 connected to a terminal of an RF generator 14 that may provide a 13.56 MHZ signal, for example, and have its other terminal grounded. The chuck 16 and an intermediate perforated electrode or rib 18 are both at ground potential. The chuck 16 is temperature insulated from the frame or housing 20 as by an annularly shaped insulator body 22. A fluorine containing gas such as $NF_3$, $CF_4$ or $SF_6$, is available from supply 24 and directed through a gas opening in the housing cap which may be associated with the upper electrode 12.

Chuck 16 is provided with a temperature controller 26 which detects the chuck temperature and is effective to raise or, where desired, lower the chuck temperature. An important feature of the present invention is to maintain the temperature at a predetermined level which is different for different substrates and mask materials. While the temperature could be caused to vary according to a programmed schedule during the etching process, in the illustrated embodiment it is contemplated that the temperature will be held at a single level throughout the etching cycle of a particular substrate.

The control signal from the temperature controller 26 may cause heat to be added to the chuck 16 by electrical heaters dispersed throughout the block, by circulating a fluid in a channel in the block or by any other suitable heat adding device. Where a circulating fluid is used, the heat exchange fluid may advantageously be a liquid such as water or a similar heat exchange liquid having a higher boiling point for operation at temperatures in excess of 100° C.

The control signal from the temperature controller 26 may cause heat to be removed from chuck 16. This is most easily accomplished by providing a liquid circulation path which may be in the form of a cavity or channel that is part of the chuck. A conventional heat exchanger may be used with the circulating liquid where desired.

Figure 2:
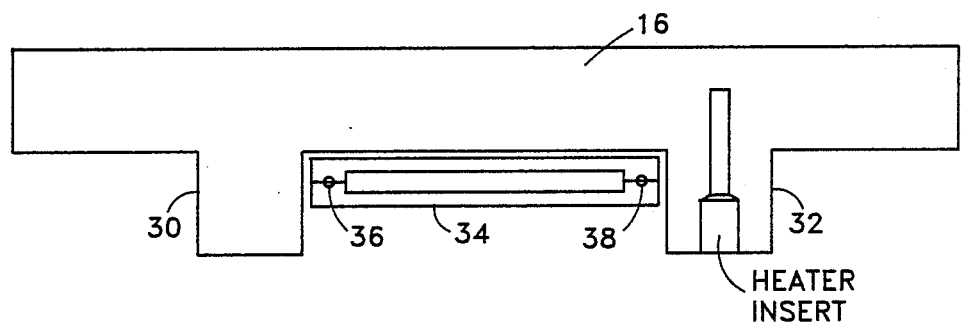
FIG. 2 is a view in elevation to an enlarged scale of the substrate supporting chuck shown in FIG. 1.

With reference also to FIG. 2, a cylindrical projection 30 is shown to extend from the lower surface of chuck 16. The projection 30 is provided with a number of equally spaced bores 32 for receiving electrical heaters. The power to the heaters is controlled by the temperature controller 26 shown in FIG. 1 thereby providing a temperature control loop and a stabilized temperature for chuck 16. Chuck 16 is also shown to have a centrally disposed water cooling channel which is adapted to be supplied with tap water through an inlet 36 and an outlet 38.

Figure 3:
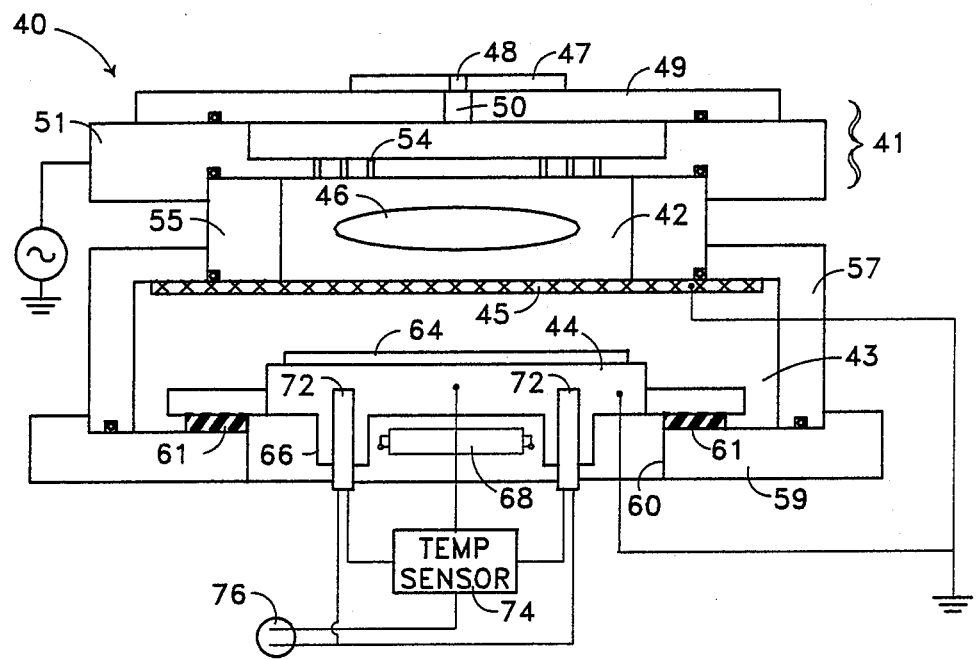
FIG. 3 is a view of another parallel plate reactor incorporating the present invention.

FIG. 3 shows the preferred embodiment of the present invention which has been incorporated in a modified form of a parallel plate reactor of a type in commercial use that is the subject of a co-pending application of Gary Powell having Ser. No. 07/238,462 filed Aug. 30, 1988 and assigned to the assignee of the present invention. The disclosure of that application is hereby incorporated by reference.

FIG. 3 shows a cross sectional view of a parallel plate reactor, generally designated 40 which has an upper electrode portion 41, an upper RF chamber 42, a lower chamber 43, a lower electrode or chuck 44, and grid 45. As illustrated in FIG. 3, the plasma envelope 46 is generated between grid 45 and 41.

Electrode 41 consists of a cap 47 having a gas opening 48 therein. Cap 47 is mounted on a lid 49. Lid 49 also contains a gas opening 50 which coincides with opening 48 of cap 47. As is known in the art, lid 49 can contain vias for the circulation of water. The circulating water is used to cool reactor 40. Cap 47 acts as a cover for the water vias.

Lid 49 is disposed on a bottom disc 51 to form a gas mixing chamber therebetween. Disc 51 contains a plurality of openings 54 through which reactant gas passes. The reactant gas is passed through openings 54 into upper chamber 42 where the plasma 46 is formed. The walls of chamber 42 are provided by an insulator 55. The insulator is made preferably of aluminum oxide ($Al_{22}O_3$).

Defining the bottom of chamber 42 is grid 45. Grid 45 may be made of an electrically conductive perforated aluminum sheet that has any suitable shape. The grid 45 is coupled to the inner surface of body 57. Disposed about grid 45 and defining the circumference of lower chamber 43 is a chamber body 57.

The chamber body 57 is mounted on a base plate 59 which has a central opening defined by vertical cylindrical walls 60. Mounted on the base plate 59, inside lower chamber 43, is an annularly shaped insulator 61 which is comprised for example, of aluminum oxide. It should be noted here that since grid 45 and lower electrode or chuck 44 are at the same electrical potential, the insulator 61 is solely for use as a heat insulator which is one of the changes that has been made to the device disclosed in the above-identified application.

A substrate 64, such as a semiconductor wafer, is disposed on the surface of the chuck 44 such that a surface of substrate 64 is facing lower chamber 43.

Figures 4, 5:
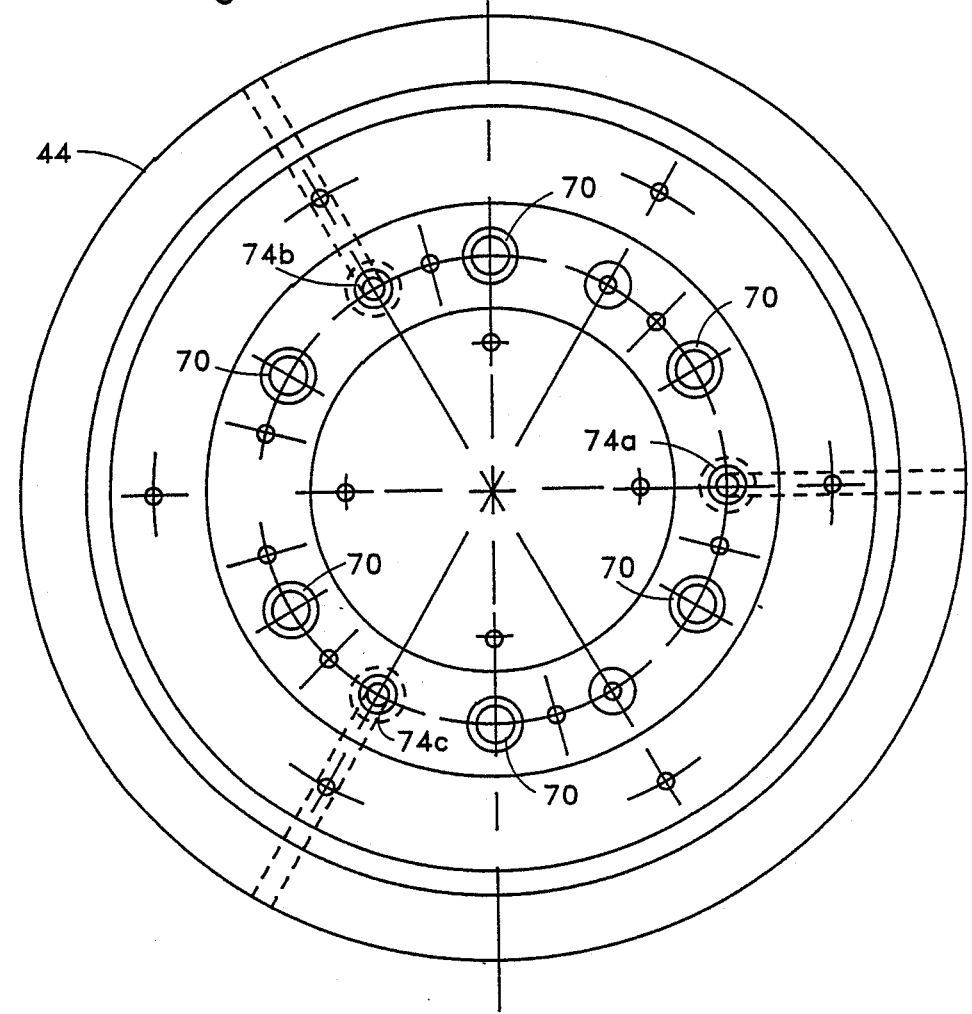
FIG. 4 is a view in section of a chuck that is similar to the chuck shown in FIG. 2.
FIG. 5 is a bottom plan view of the chuck of FIG. 4.

With reference also to FIG. 4, the chuck or lower electrode 44 as incorporated in the device of FIG. 3 has a cylindrical projection 66 which may have a central bore that serves as the cooling cavity and is adapted to receive a water cooling channel 68 that is indicated in FIG. 3. In the projection 66 which may have a nominal diameter of about 4", six equally spaced bores 70 (see FIG. 5) are provided which are adapted to receive the heater elements 72 as illustrated in FIG. 3. The temperature sensor 74 may be connected to one of the leads from a power supply terminal 76 in order to regulate the amount of power supplied to each of the electrical heaters 72.

With reference to FIG. 5, the temperature sensor may comprise three equally spaced temperature sensing units 74a, 74b, 74c which are equally spaced and located to be between two adjacent heater elements in bores 70. In order to provide better uniformity of heat throughout the surface of the chuck, each temperature sensing element 74 controls the power supplied to the two immediately adjacent heating elements 72 that are in their respective bores 70. Thus, the number of temperature sensing elements 74a, 74b, 74c may be one-half of the number of heater elements 72 with the heating elements that are on the opposite sides of a temperature sensing element being controlled by the intermediate temperature sensing element.

By use of the temperature control loop according to the present invention in elevated temperature etch processing, an accurately reproducible chemical reaction rate is provided. Etch processes in the semiconductor industry are typically performed where substrate temperatures are less than about 80° C. A significant benefit of an elevated substrate temperature higher than the plasma produced temperature, or above about 100° C., is increased reaction rate. Higher rates make applications possible which could not be performed previously and increase the productivity of the reactor apparatus. Further, increasing reaction rate can be attained without the likelihood of damage to the semiconductor devices as has occurred on some occasions when elevated plasma potentials are used.

The apparatus disclosed utilizes an electrically heated surface where the substrate temperature is regulated at temperatures in excess of 80° C. with accuracy and reproducibility. The control embodies a closed loop heater arrangement that may optionally be coupled with a cooling loop to extend the effective lower limit of the control window. The disclosed embodiments are intended to be illustrative and all changes or modifications which fall within the scope of the claims are intended to be covered.

We claim:

1. In a method of etching a substrate exposed to a plasma generated by subjecting a reactant gas to an RF field while the substrate is supported on a chuck, the steps of increasing etch reaction rate without increased likelihood of substrate damage by controlling the temperature level of the chuck to a predetermined elevated level but below a temperature level at which degradation of the material exposed to said plasma occurs by sensing a temperature in the vicinity of the chuck to produce a control signal which is applied to a chuck temperature control means to maintain the chuck temperature at said predetermined level.

2. In a method of etching a substrate exposed to a plasma generated by subjecting a reactant gas to an RF field while the substrate is supported on a chuck, the steps of increasing the etch rate by controlling the temperature level of the chuck to a predetermined elevated level but below a temperature level at which degradation of a material exposed to said plasma occurs by sensing the temperature of the chuck and adding heat to said chuck in response to sensed chuck temperature lower than said predetermined high level.

3. The method as defined in claim 2 wherein the chuck is provided with a number of bores that are uniformly spaced and electrical heating elements are located in said bores, and further comprising the step of producing a control signal in response to the temperature that is sensed in said chuck to control the heat produced by respective ones of said electrical heating elements.

4. The method as defined in claim 3 further comprising providing a uniform temperature gradient for said chuck by providing a plurality of temperature sensing elements that are equal in number to one-half the number of heating elements with heating elements on opposite sides of a temperature sensing element being controlled in response to the temperature detected at an intermediate temperature sensing element.

5. Apparatus for plasma etching of a substrate comprising:
   a housing having a base;
   first and second electrodes coupled to an RF generator for producing a plasma between said electrodes;
   one of said electrodes being mounted on said base by a heat insulation member so as to support a substrate at a location to be exposed to said plasma on a surface of a chuck;
   mean associated with said chuck to maintain the chuck at a predetermined temperature that is elevated relative to a plasma produced chuck temperature;
   means for sensing the temperature of said chuck and producing a control signal in response to a chuck temperature is less than said predetermined temperature; and
   means connecting said control signal to said chuck temperature control means to provide an increased substrate reaction rate without increased likelihood of substrate damage.

6. Apparatus as defined in claim 5 wherein the chuck contains a number of bores that are uniformly spaced and have electrical heating elements located therein, and wherein said heating elements are electrically connected to operate in response to said control signal.

7. Apparatus as defined in claim 6 wherein the temperature sensing means comprises a plurality of temperature sensing elements that are equal in number to one half the number of heating elements with heating elements on opposite sides of a temperature sensing element being controlled in response to the temperature detected at an intermediate temperature sensing element.

8. Apparatus for plasma etching of a substrate comprising:
   an upper electrode coupled to a power source;
   a lower electrode coupled to ground and underlying a chuck surface for supporting said substrate;
   a grid having openings defined therein which is disposed between said upper electrode and said lower electrode, said grid being coupled to ground; and
   means for increasing the substrate etch rate without increased likelihood of substrate damage by controlling the temperature of the chuck surface to a predetermined elevated temperature level above about 100° C. and below the temperature level at which degradation of a material in said apparatus occurs including;
   means associated with said chuck to control the chuck temperature;
   means responsive to the temperature of said chuck for producing a signal indicative of a chuck surface temperature departure from said predetermined temperature level; and
   means connecting said control signal to said chuck temperature control means to maintain the chuck surface temperature substantially equal to said predetermined temperature.

9. Apparatus as defined in claim 8 wherein the chuck contains a number of bores that are uniformly spaced and have electrical heating elements located therein, said heating elements being electrically connected to operate in response to said control signal.

10. Apparatus as defined in claim 9 wherein the temperature sensing means comprise a plurality of temperature sensing elements that are equal in number to one half the number of heating elements with heating elements on opposite sides of a temperature sensing element being controlled in response to the temperature detected at an intermediate temperature sensing element.

* * * * *